US010424496B2

(12) United States Patent
Inoue et al.

(10) Patent No.: US 10,424,496 B2
(45) Date of Patent: Sep. 24, 2019

(54) SUBSTRATE TREATING METHOD

(71) Applicant: SCREEN Holdings Co., Ltd., Kyoto (JP)

(72) Inventors: Masafumi Inoue, Kyoto (JP); Akiyoshi Nakano, Kyoto (JP); Kurumi Yagi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 78 days.

(21) Appl. No.: 15/700,411

(22) Filed: Sep. 11, 2017

(65) Prior Publication Data

US 2017/0372921 A1 Dec. 28, 2017

Related U.S. Application Data

(62) Division of application No. 14/551,258, filed on Nov. 24, 2014, now abandoned.

(30) Foreign Application Priority Data

Mar. 24, 2014 (JP) ................................. 2014-059748

(51) Int. Cl.
*H01L 21/67* (2006.01)
(52) U.S. Cl.
CPC .... *H01L 21/6708* (2013.01); *H01L 21/67109* (2013.01)
(58) Field of Classification Search
None
See application file for complete search history.

(56) References Cited

U.S. PATENT DOCUMENTS

| 6,645,344 | B2 | 11/2003 | Caldwell | 118/500 |
| 7,241,362 | B2 | 7/2007 | Shimbara | 118/730 |
| 7,722,736 | B2 | 5/2010 | Miya | 134/119 |
| 8,398,817 | B2 | 3/2013 | Namba | 156/345.21 |
| 8,663,397 | B1 * | 3/2014 | Kahlon | H01L 21/02041 134/26 |
| 9,048,269 | B2 | 6/2015 | Higashijima | |
| 2004/0084143 | A1 | 5/2004 | Ivanov | 156/345.11 |
| 2004/0234696 | A1 | 11/2004 | Hongo | 427/328 |
| 2004/0253833 | A1 * | 12/2004 | Takehiko | H01L 21/67051 438/778 |
| 2005/0084615 | A1 | 4/2005 | Weidman | 427/305 |
| 2007/0128373 | A1 | 6/2007 | Hara et al. | 427/443.1 |

(Continued)

FOREIGN PATENT DOCUMENTS

| JP | 5-36663 | 2/1993 |
| JP | 2000-334397 A | 12/2000 |

(Continued)

OTHER PUBLICATIONS

Taiwanese Office Action dated Jan. 12, 2016 in corresponding TW Application No. 103132748.

*Primary Examiner* — Allan W. Olsen
(74) *Attorney, Agent, or Firm* — Ostrolenk Faber LLP

(57) ABSTRACT

An upper end of a tubular member surrounding a common pipe line is closed by a lid member. The lid member has an opening formed therein for supplying liquids to adjacent the rotation center on the back surface of a wafer. Deionized water supplied at normal temperature to the interior of the tubular member, after serving to cool the common pipe line, flows out of a lower end of the tubular member.

10 Claims, 4 Drawing Sheets

(56) References Cited

U.S. PATENT DOCUMENTS

| | | | |
|---|---|---|---|
| 2008/0083501 A1 | 4/2008 | Arai | 156/345.21 |
| 2011/0048468 A1 | 3/2011 | Amano et al. | 134/32 |
| 2012/0103371 A1* | 5/2012 | Yun | H01L 21/67034 134/26 |
| 2012/0175819 A1 | 7/2012 | Miya | 264/334 |
| 2013/0344689 A1 | 12/2013 | Moriya et al. | 438/486 |
| 2014/0051259 A1 | 2/2014 | Shibayama | 438/748 |
| 2014/0065295 A1* | 3/2014 | Emoto | B05D 1/005 427/8 |
| 2014/0356539 A1 | 12/2014 | Inatomi | 427/315 |
| 2015/0075571 A1 | 3/2015 | Miura | 134/99.1 |
| 2015/0270145 A1 | 9/2015 | Inoue | 156/345.18 |

FOREIGN PATENT DOCUMENTS

| | | |
|---|---|---|
| JP | 2003-297788 | 10/2003 |
| JP | 2004-273838 | 9/2004 |
| JP | 2007-227765 | 9/2007 |
| JP | 2012-156561 | 8/2012 |
| JP | 2013-207267 | 10/2013 |
| JP | 2013-243413 | 12/2013 |
| TW | 201405669 A | 2/2014 |
| TW | 201409593 A | 3/2014 |
| TW | 201411715 A | 3/2014 |

* cited by examiner

SUBSTRATE TREATING METHOD

CROSS REFERENCE TO RELATED APPLICATION

This application is a divisional of U.S. patent application Ser. No. 14/551,258, filed Nov. 24, 2014, which claims the benefit of Japanese Patent Application No. 2014-059748, filed Mar. 24, 2014, which is incorporated herein by reference.

BACKGROUND OF THE INVENTION

1. Field of the Invention

This invention relates to a substrate treating apparatus for treating substrates by supplying treating solutions to front surfaces and back surfaces of the substrates. The substrates may, for example, be glass substrates for organic EL displays, glass substrates for liquid crystal displays, panel substrates for solar cells, glass substrates for plasma displays, glass substrates for photomasks, substrates for optical disks, or semiconductor wafers, for example.

2. Description of the Related Art

A substrate treating apparatus which carries out etching treatment with hydrofluoric acid (HF) for surfaces of a semiconductor wafer as a substrate, for example, supplies hydrofluoric acid to front and back surfaces of the semiconductor wafer for the purpose of etching both the front and back surfaces of the semiconductor wafer, or for the purpose of bringing the temperature of the semiconductor wafer close to the temperature of hydrofluoric acid in order to etch the surfaces of the semiconductor wafer uniformly. The apparatus employs a construction which supplies deionized water to both the front and back surfaces of the semiconductor wafer for rinsing treatment after the etching treatment with hydrofluoric acid, subsequently supplies heated deionized water to the back surface of the semiconductor wafer to raise the temperature of the semiconductor wafer, and then spins the semiconductor wafer at high speed to scatter the deionized water off the semiconductor wafer and dry the latter. A construction is also employed, which promotes the effect of drying the surfaces of the semiconductor wafer in time of the spin drying by supplying an organic solvent such as isopropyl alcohol (IPA) to the surfaces of the semiconductor wafer when supplying the heated deionized water to the surfaces of the semiconductor wafer (see Japanese Unexamined Patent Publication No. 2012-156561).

In such a substrate treating apparatus, generally, a semiconductor wafer is held by a spin chuck, a treating solution such as hydrofluoric acid is supplied to the front surface and back surface of the semiconductor wafer spinning as held by the spin chuck. At this time, plural types of treating liquid can be supplied to the front surface of the semiconductor wafer by selectively using a plurality of treating liquid supply nozzles corresponding to the plural types of treating liquid. However, such degree of freedom is hardly available for the back surface of the semiconductor wafer. That is, when supplying plural types of treating liquid to the back surface of the semiconductor wafer, it is necessary to use a common pipe line for flowing the plural types of treating liquid, and supply the plural types of treating liquid from this common pipe line toward the spin center on the back surface of the semiconductor wafer spinning as held by the spin chuck.

Further, when heated deionized water is supplied to the back surface of the semiconductor wafer using such a common pipe line, the temperature of the common pipe line will rise. Since the temperature of the common pipe line rises further by heat accumulation when such a process is performed continuously, the temperature of the common pipe line exerts a gradually increasing influence on the treating liquid supplied to the back surface of the semiconductor wafer through the common pipe line.

Generally, the etching rate by hydrofluoric acid is dependent on the temperature of hydrofluoric acid. Therefore, when changes occur to the temperature of the treating liquid supplied to the back surface of the semiconductor wafer, that etching rate will also change. This makes it impossible to carry out uniform etching treatment between a plurality of semiconductor wafers.

In contrast with hydrofluoric acid supplied to the front surface, a hot treating liquid, when supplied toward the rotation center on the back surface of the semiconductor wafer spinning as held by the spin chuck, will produce a temperature difference between an area adjacent the rotation center and an area adjacent an edge of the semiconductor wafer. Such a temperature difference gives rise to a problem of marring the uniformity of etching over the surface of the semiconductor wafer.

In order to solve such problem, it is conceivable to rinse the semiconductor wafer with deionized water before hydrofluoric acid treatment. However, when such construction is employed, it will become difficult to collect and reuse hydrofluoric acid, and there will occur a problem that treatment time will become all the longer for execution of the rinsing step.

SUMMARY OF THE INVENTION

The object of this invention, therefore, is to provide a substrate treating apparatus capable of treating a substrate uniformly also when a treating solution and warm water are supplied to the back surface of the substrate using a common pipe line.

The above object is fulfilled, according to this invention, by a substrate treating apparatus having a front surface treating solution supply unit for supplying a treating solution to a front surface of a substrate spinning as held by a spin chuck, a common pipe line for supplying liquids to adjacent a rotation center on a back surface of the substrate spinning as held by the spin chuck, a back surface treating solution supply unit for supplying the treating solution to the common pipe line, and a warm water supply unit for supplying warm water to the common pipe line, the apparatus comprising a cooling mechanism for cooling the common pipe line by supplying a fluid to outer peripheries of the common pipe line.

According to such substrate treating apparatus, the substrate can be treated uniformly by cooling the common pipe line by action of the cooling mechanism to prevent a temperature increase of the treating solution supplied to the back surface of the substrate.

In one preferred embodiment, the substrate treating apparatus further comprises an organic solvent supply unit for supplying an organic solvent to the front surface of the substrate spinning as held by the spin chuck, wherein the warm water supply unit is arranged to supply the warm water to the common pipe line when the organic solvent supply unit supplies the organic solvent to the front surface of the substrate spinning as held by the spin chuck.

According to such substrate treating apparatus, the substrate can be dried promptly by action of the organic solvent and warm water.

In another preferred embodiment, the substrate treating apparatus further comprises a multiple valve having a plurality of inlet and outlet ports, wherein the common pipe line is connected to one of the inlet and outlet ports of the multiple valve, the back surface treating solution supply unit is arranged to supply the treating solution to one of the inlet and outlet ports of the multiple valve, and the warm water supply unit is arranged to supply the warm water to one of the inlet and outlet ports of the multiple valve.

According to such substrate treating apparatus, the treating solution and warm water can be supplied to the common pipe line by using the multiple valve.

In a further preferred embodiment, the substrate treating apparatus further comprises a switch valve disposed between the multiple valve and the common pipe line, a deionized water supply unit for supplying deionized water at normal temperature to one of the inlet and outlet ports of the multiple valve, and a suction unit for sucking an interior space of the multiple valve from one of the inlet and outlet ports of the multiple valve.

According to such substrate treating apparatus, a temperature increase of the multiple valve can be prevented by supplying deionized water at normal temperature from the deionized water supply unit into the multiple valve, and sucking deionized water in the multiple valve by the suction unit, in a state of the switch valve being closed.

In a still further preferred embodiment, the substrate treating apparatus further comprises an inert gas supplying device for supplying an inert gas to the front surface of the substrate spinning as held by the spin chuck when drying the substrate by spinning the substrate held by the spin chuck at high speed, wherein the cooling mechanism is arranged to supply the cooling water to the outer peripheries of the common pipe line while the inert gas supply device is supplying the inert gas to the front surface of the substrate spinning as held by the spin chuck.

According to such substrate treating apparatus, the common pipe line can be cooled while drying of the substrate is expedited by the inert gas.

Other features and advantages of the invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
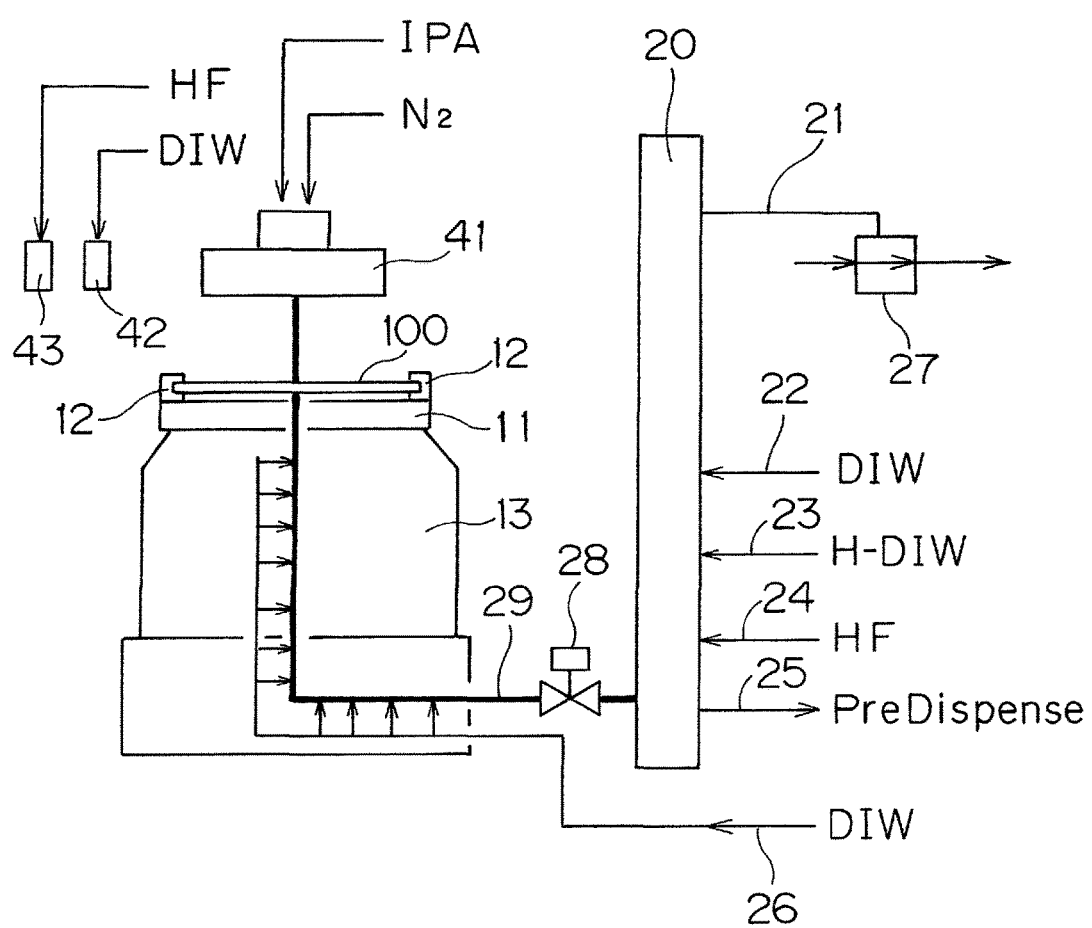
FIG. 1 is a schematic view of a substrate treating apparatus according to this invention.

An embodiment of this invention will be described hereinafter with reference to the drawings. FIG. 1 is a schematic view of a substrate treating apparatus according to this invention.

This substrate treating apparatus is used to perform etching treatment with hydrofluoric acid of a semiconductor wafer 100 as a substrate, and includes a spin chuck 11 for rotatably holding the semiconductor wafer 100. The spin chuck 11 has a plurality of chuck members 12 arranged on an upper surface thereof for holding edges of the semiconductor wafer 100. The spin chuck 11 is driven by a motor mounted inside a base 13 to spin about a central axis extending vertically. The spin chuck 11 is surrounded by a cup member, not shown, for capturing liquids scattering from the semiconductor wafer 100 in a spin.

This substrate treating apparatus includes a compound nozzle 41 for supplying isopropyl alcohol as an organic solvent and nitrogen gas as an inert gas to the front surface of the semiconductor wafer 100 spinning as held by the spin chuck 11. The substrate treating apparatus further includes a nozzle 43 for supplying hydrofluoric acid as a treating solution, and a nozzle 42 for supplying deionized water (DIW) as a rinsing liquid, to the front surface of the semiconductor wafer 100 spinning as held by the spin chuck 11. These compound nozzle 41, nozzle 42 and nozzle 43 are selectively placed above the semiconductor wafer 100 spinning as held by the spin chuck 11. As the compound nozzle 41, for example, what is described in the specification of U.S. Pat. No. 5,308,211 may be used.

This substrate treating apparatus also includes a multiple valve 20 having six inlet and outlet ports. One of the inlet and outlet ports of this multiple valve 20 is connected through a switch valve 28 to a common pipe line 29 for supplying liquids to adjacent the rotation center on a back surface of the semiconductor wafer 100 spinning as held by the spin chuck 11. The other inlet and outlet ports of the multiple valve 20 are connected, respectively, to a pipe line 21 connected to a sackback unit 27 for sacking an interior space of the multiple valve 20, to a pipe line 22 for supplying deionized water at normal temperature to the multiple valve 20, to a pipe line 23 for supplying deionized water heated as warm water to the multiple valve 20, to a pipe line 24 for supplying hydrofluoric acid as a treating solution to the multiple valve 20, and to a pipe line 25 for discharging deionized water at a pre-dispense time of the multiple valve 20.

The substrate treating apparatus further includes cooling water supply piping 26 constituting part of a cooling mechanism for cooling the common pipe line 29 by supplying deionized water at normal temperature as cooling water to outer peripheries of the common pipe line 29.

Figure 2:
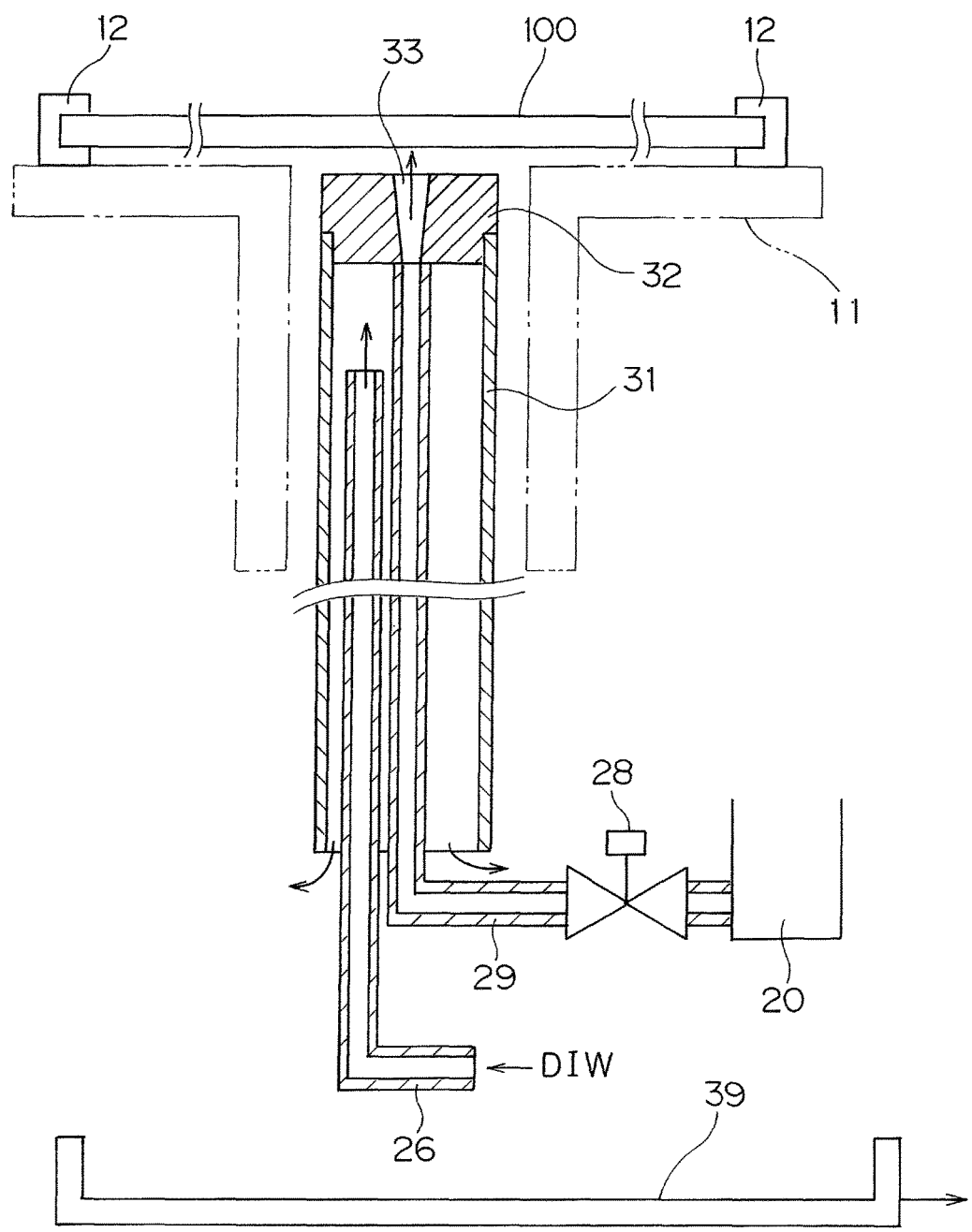
FIG. 2 is a schematic view showing a cooling mechanism.

FIG. 2 is a schematic view of the cooling mechanism for cooling the common pipe line 29.

This cooling mechanism has a tubular member 31 surrounding the common pipe line 29. The tubular member 31 has an upper end thereof closed by a lid member 32. The lid member 32 has an opening 33 connected to an end edge of the common pipe line 29 for supplying liquids to adjacent the rotation center on the back surface of the semiconductor wafer 100 spinning as held by the spin chuck 11. The tubular member 31 is disposed in a central area of the spin chuck 11 as spaced from the spin chuck 11. The tubular member 31 does not therefore rotate with spinning of the spin chuck 11, and supports the opening 33 in a position opposed to the central area on the back surface of the semiconductor wafer 100. The cooling water supply piping 26 supplies deionized water at normal temperature to the interior of this tubular member 31. The deionized water supplied at normal temperature to the interior of the tubular member 31, after having served to cool the common pipe line 29, flows out of a lower end of the tubular member 31. The deionized water having flowed out of the lower end of the tubular member 31 is discharged from a butt 39 disposed below, out of the apparatus.

Figure 3:
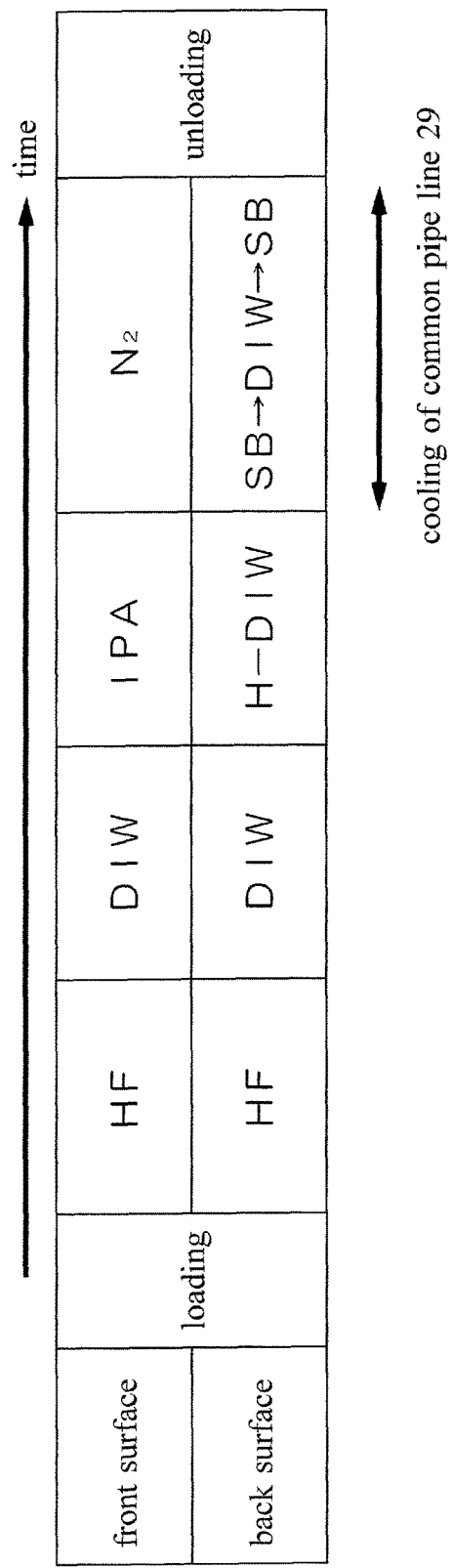
FIG. 3 is a table illustrating steps of treating a semiconductor wafer.

Next, an etching process of the semiconductor wafer 100 by this substrate treating apparatus will be described. FIG. 3 is a table illustrating steps of treating the semiconductor wafer 100.

First, the semiconductor wafer 100 is loaded into the apparatus and is held by the chuck members 12 on the spin chuck 11. Then, the semiconductor wafer 100 is spun with the spin chuck 11. In this state, the nozzle 43 is moved to a position over the semiconductor wafer 100 spinning as held by the spin chuck 11, and hydrofluoric acid is discharged from the nozzle 43 onto the front surface of the semiconductor wafer 100. In parallel with this, by supplying hydrofluoric acid from the pipe line 24 to the multiple valve 20 and opening the switch valve 28, hydrofluoric acid is supplied from the common pipe line 29 to adjacent the rotation center on the back surface of the semiconductor wafer 100 spinning as held by the spin chuck 11. This results in the entire surfaces of the semiconductor wafer 100 having a uniform temperature distribution, which enables uniform etching treatment of the surfaces. By supplying the same hydrofluoric acid to the front and back surfaces, the hydrofluoric acid is captured by the cup member disposed around the semiconductor wafer 100. Therefore, the hydrofluoric acid can be collected without impurities such as deionized water mixing in.

Next, the nozzle 42 is moved to a position over the semiconductor wafer 100 spinning as held by the spin chuck 11, and deionized water is discharged from the nozzle 42 onto the front surface of the semiconductor wafer 100. In parallel with this, by supplying deionized water from the pipe line 22 to the multiple valve 20, deionized water is supplied from the common pipe line 29 to adjacent the rotation center on the back surface of the semiconductor wafer 100 spinning as held by the spin chuck 11. Consequently, rinsing treatment of both the front and back surfaces of the semiconductor wafer 100 is carried out with deionized water.

Next, the compound nozzle 41 is moved to a position over the semiconductor wafer 100 spinning as held by the spin chuck 11, and isopropyl alcohol is discharged from compound nozzle 41 onto the front surface of the semiconductor wafer 100. In parallel with this, by supplying deionized water heated to about 75 degrees C. from the pipe line 23 to the multiple valve 20, the heated deionized water is supplied from the common pipe line 29 to adjacent the rotation center on the back surface of the semiconductor wafer 100 spinning as held by the spin chuck 11. Consequently, while the front surface of the semiconductor wafer 100 is covered by highly volatile isopropyl alcohol, the temperature of the semiconductor wafer 100 is raised by the warm water which has been heated to about 75 degrees C.

Next, nitrogen gas is discharged from the compound nozzle 41 toward the front surface of the semiconductor wafer 100, and the spin chuck 11 is spun at high speed to spin-dry the semiconductor wafer 100. At this time, the front surface of the semiconductor wafer 100 is covered with highly volatile isopropyl alcohol, and the semiconductor wafer 100 itself has been heated by action of the heated deionized water, whereby the semiconductor wafer 100 is dried promptly. In parallel with this step of drying the semiconductor wafer 100, the multiple valve 20 and common pipe line 29 are cooled.

For the multiple valve 20, first, in a state of the switch valve 28 being closed, the interior space of the multiple valve 20 is sacked by action of the sackback unit 27 to discharge heated deionized water remaining in the interior space of the multiple valve 20 (step SB in FIG. 3). Next, the multiple valve 20 is cooled by supplying deionized water at normal temperature from the pipe line 22 to the multiple valve 20 (step DIW in FIG. 3). Then, the interior space of the multiple valve 20 is sacked again by action of the sackback unit 27 to discharge deionized water and the like remaining in the interior space of the multiple valve 20 (step SB in FIG. 3). This completes the cooling of the multiple valve 20.

On the other hand, in parallel with this multiple valve cooling process, deionized water is supplied at normal temperature from the cooling water supply piping 26 to the interior of the tubular member 31 surrounding the common pipe line 29. The deionized water supplied at normal temperature to the interior of the tubular member 31, after having served to cool the common pipe line 29, flows out of the lower end of the tubular member 31. Consequently, the common pipe line 29 is cooled.

When the etching process for one semiconductor wafer 100 is completed through the above steps, the semiconductor wafer 100 is unloaded from the apparatus. Subsequently, a next semiconductor wafer 100 is loaded into the apparatus, and an etching process is performed for both the front and back surfaces of the semiconductor wafer 100 with hydrofluoric acid. At this time, the multiple valve 20 and common pipe line 29 have been cooled by deionized water at normal temperature. This can effectively prevent the semiconductor wafer 100 being treated unevenly due to a temperature increase of hydrofluoric acid supplied to the back surface of the semiconductor wafer 100.

Figure 4:
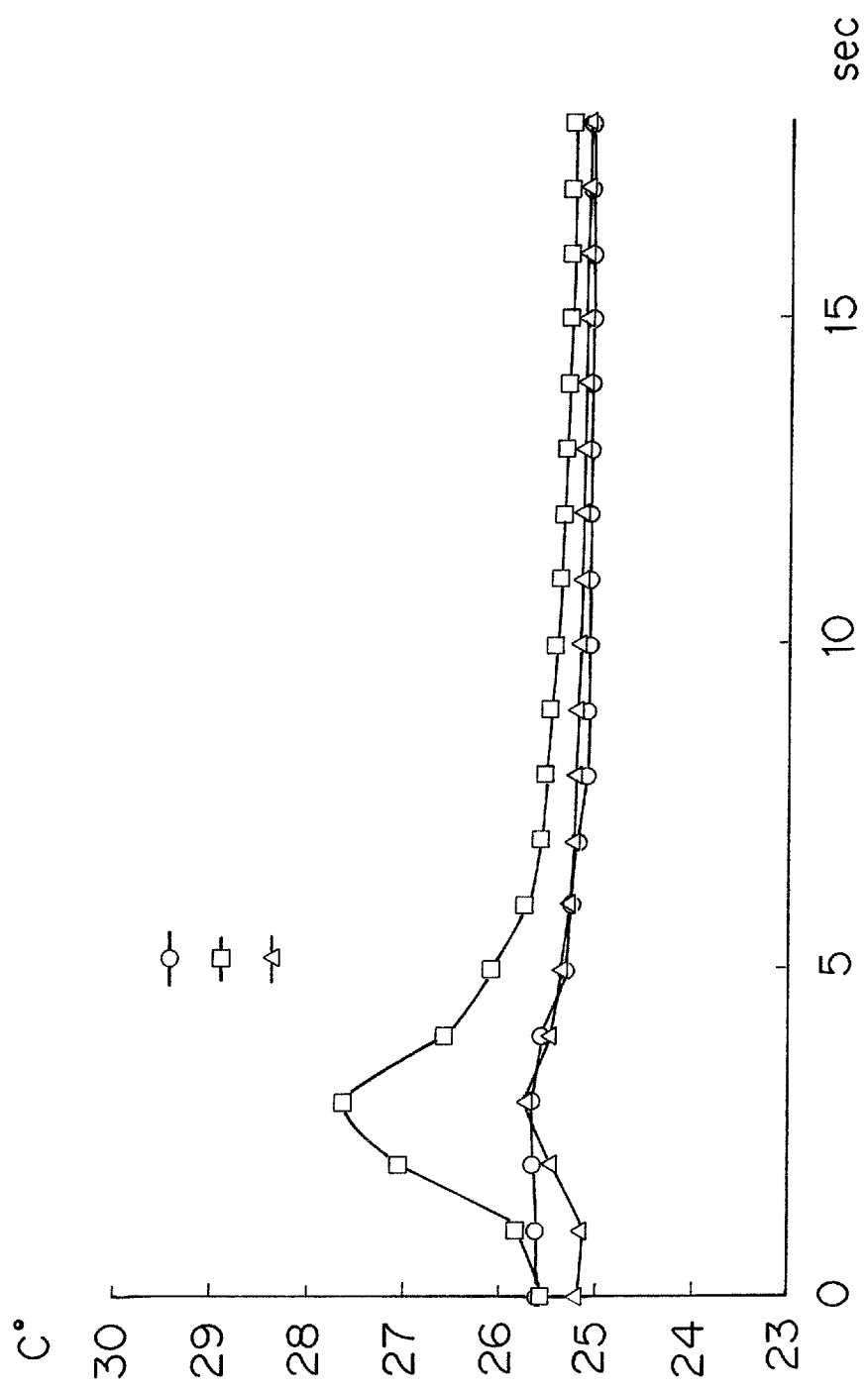
FIG. 4 shows graphs representing temperature changes of the semiconductor wafer.

FIG. 4 shows graphs representing temperature changes of the semiconductor wafer 100 occurring with a series of etching processes. The vertical axis in FIG. 4 represents temperatures of the semiconductor wafer 100, and the horizontal axis represents time from start of treatment of one semiconductor wafer 100.

The graph with circular marks in FIG. 4 indicates temperature changes of a first semiconductor wafer 100 being treated. The graph with square marks indicates temperature changes of a semiconductor wafer 100 occurring when the above cooling operation for the multiple valve 20 is carried out, but the cooling operation is not carried out for the common pipe line 29. Further, the graph with triangular marks indicates temperature changes of a semiconductor wafer 100 when the cooling operations are carried out for both the multiple valve 20 and common pipe line 29.

As shown in this figure, when the cooling operations are carried out for both the multiple valve 20 and common pipe line 29, a temperature increase of the semiconductor wafer 100 can be prevented by heat storage in the common pipe line 29. Consequently, when treating semiconductor wafers 100 successively, the heat storage in the common pipe line 29 is effective in preventing uneven treatment of the semiconductor wafers 100.

In the embodiment described above, the common pipe line 29 is cooled with deionized water at normal temperature as cooling water. While this is done in order to keep the apparatus clean, tap water or the like may be used as cooling water as long as the flow path of the cooling water can be blocked completely. Not only with a liquid, the common pipe line 29 may be cooled with a fluid such as air.

In the embodiment described above, this invention is applied to the substrate treating apparatus which carries out an etching process for semiconductor wafers 100 using hydrofluoric acid as treating solution. However, this invention may be applied to substrate treating apparatus which use other treating solutions.

This invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2014-059748 filed in the Japanese Patent Office on Mar. 24, 2014, the entire disclosure of which is incorporated herein by reference.

What is claimed is:

1. A substrate treating method, comprising:
   a treating solution supplying step of supplying a treating solution to a front surface of a substrate spinning as held by a spin chuck, and to the vicinity of a rotation center on a back surface of the substrate spinning as held by the spin chuck via a common pipe line;
   a heated water supplying step of supplying heated water to the vicinity of the rotation center on the back surface of the substrate spinning as held by the spin chuck via the common pipe line;
   a drying step of drying the substrate; and
   a cooling step executed concurrently with the drying step of cooling the common pipe line by supplying a fluid to outer peripheries of the common pipe line.

2. The substrate treating method according to claim 1, wherein
   the heated water supplying step includes supplying an organic solvent to the front surface of the substrate spinning as held by the spin chuck.

3. The substrate treating method according to claim 2, wherein the organic solvent is isopropyl alcohol.

4. The substrate treating method according to claim 1, wherein the common pipe line is connected to one of a plurality of inlet and outlet ports of a multiple valve having said plurality of inlet and outlet ports, and the treating solution supplying step includes supplying the treating solution to one of the plurality of inlet and outlet ports of the multiple valve; and the heated water supplying step includes supplying the heated water to one of the plurality of inlet and outlet ports of the multiple valve.

5. The substrate treating method according to claim 4, wherein
   the cooling step includes supplying unheated deionized water at room temperature to one of the plurality of inlet and outlet ports of the multiple valve, and then sucking an interior space of the multiple valve from one of the plurality of inlet and outlet ports of the multiple valve.

6. The substrate treating method according to claim 1, wherein
   the cooling step includes supplying cooling water to the outer peripheries of the common pipe line.

7. The substrate treating method according to claim 6, wherein
   the cooling step includes supplying the cooling water to an interior of a tubular member surrounding the common pipe line.

8. The substrate treating method according to claim 7, wherein
   the drying step includes drying the substrate by spinning the substrate held by the spin chuck; and supplying an inert gas to the front surface of the substrate spinning as held by the spin chuck.

9. The substrate treating method according to claim 1, wherein the treating solution is hydrofluoric acid.

10. The substrate treating method according to claim 1, wherein substrates are treated continuously, and wherein the cooling step is executed to treat a subsequent substrate before supplying the treating solution to the common pipe line.

* * * * *